US011871535B2

(12) United States Patent
McCrary et al.

(10) Patent No.: US 11,871,535 B2
(45) Date of Patent: Jan. 9, 2024

(54) HVAC-LESS ENCLOSURE WITH TEMPERATURE RANGE AUGMENTING RECIRCULATION SYSTEM

(71) Applicant: TMEIC Corporation, Salem, VA (US)

(72) Inventors: D. Jason McCrary, Roanoke, VA (US); Paul S. Bixel, Salem, VA (US); Manish Verma, Frisco, TX (US)

(73) Assignee: TMEIC Corporation, Roanoke, VA (US)

( * ) Notice: Subject to any disclaimer, the term of this patent is extended or adjusted under 35 U.S.C. 154(b) by 704 days.

(21) Appl. No.: 16/584,369

(22) Filed: Sep. 26, 2019

(65) Prior Publication Data
US 2020/0107467 A1    Apr. 2, 2020

Related U.S. Application Data

(60) Provisional application No. 62/738,641, filed on Sep. 28, 2018.

(51) Int. Cl.
*H05K 7/20* (2006.01)
*F24F 3/147* (2006.01)

(52) U.S. Cl.
CPC ......... *H05K 7/20209* (2013.01); *F24F 3/147* (2013.01); *H05K 7/20145* (2013.01)

(58) Field of Classification Search
CPC .. H05K 7/20209; H05K 7/20145; F24F 3/147
USPC ........................................................ 454/184
See application file for complete search history.

(56) References Cited

U.S. PATENT DOCUMENTS

| | | | |
|---|---|---|---|
| 6,105,875 A | 8/2000 | LaGrotta et al. | |
| 6,127,663 A | 10/2000 | Jones | |
| 6,181,557 B1 * | 1/2001 | Gatti | H05K 7/20618 361/679.48 |
| 6,470,696 B1 | 10/2002 | Palfy et al. | |
| 6,834,509 B2 | 12/2004 | Palfy et al. | |

(Continued)

FOREIGN PATENT DOCUMENTS

JP    2003249786 A    9/2003

OTHER PUBLICATIONS (Bixel, Paul) Co-pending Canadian Application No. CA3,055,363, filed Sep. 13, 2019, Specification, Claims, Figures.

(Continued)

*Primary Examiner* — Avinash A Savani
*Assistant Examiner* — Dana K Tighe
(74) *Attorney, Agent, or Firm* — New River Valley IP Law, P.C.; Michele L. Mayberry

(57) ABSTRACT

An electronic equipment enclosure which regulates incoming outside air to within the operational limits of the electronic equipment within is described. The enclosure recirculates the wasted heat from the equipment to regulate both the temperature and humidity within the enclosure to acceptable levels without relying on any heating or air conditioning component. Thus, the enclosure assembly relies entirely on air flow for regulating the temperature inside the enclosure. Additionally, the recirculation feature of the enclosure allows the electronic equipment to operate at outside temperatures much lower than the stated operational range by modifying the temperature of the intake air of the equipment. A method of controlling the temperature inside an enclosure is also described.

16 Claims, 2 Drawing Sheets

(56) References Cited

U.S. PATENT DOCUMENTS

| | | | |
|---|---|---|---|
| 6,877,551 B2 | 4/2005 | Stoller | |
| 6,883,651 B2 | 4/2005 | Fukaya | |
| 7,430,118 B1* | 9/2008 | Noteboom | H05K 7/1488 165/122 |
| 7,604,534 B2* | 10/2009 | Hill | H05K 7/20618 361/679.48 |
| 7,886,983 B2 | 2/2011 | Criss et al. | |
| 9,125,302 B2 | 9/2015 | Elkins | |
| 9,681,589 B1* | 6/2017 | Ross | H05K 7/20745 |
| 9,706,683 B2 | 7/2017 | Sprague et al. | |
| 9,863,428 B2* | 1/2018 | Tsujimoto | H05K 7/206 |
| 2011/0009047 A1* | 1/2011 | Noteboom | H05K 7/20745 454/258 |
| 2011/0057454 A1* | 3/2011 | Kawakita | F02B 63/04 290/1 A |
| 2012/0083196 A1* | 4/2012 | Mockridge | F24F 11/0001 454/239 |
| 2013/0005234 A1* | 1/2013 | Jai | H05K 7/20745 454/184 |

OTHER PUBLICATIONS (Bixel, Paul) Co-pending Mexican Application No. MX/a/2019/011576, filed Sep. 26, 2019, Specification, Claims, Figures, English Version.

(Bixel, Paul) Co-pending Mexican Application No. MX/a/2019/011576, filed Sep. 26, 2019, Specification, Claims, Figures.

Co-pending Mexican Application No. MX/a/2019/011576, Office Action dated Apr. 27, 2023 (5 pages) with English summary (1 page).

Co-pending Mexican Application No. MX/a/2019/011576, Notice of Allowance dated Aug. 30, 2023, 2 pages.

Co-pending Mexican Application No. MX/a/2019/011576, Response to Apr. 27, 2023 Office Action, dated Aug. 28, 2023 (12 pages) and English version (8 pages).

* cited by examiner

HVAC-LESS ENCLOSURE WITH TEMPERATURE RANGE AUGMENTING RECIRCULATION SYSTEM

CROSS-REFERENCE TO RELATED APPLICATIONS

The present application relies on the disclosure of and claims priority to and the benefit of the filing date of U.S. Provisional Application No. 62/738,641, filed Sep. 28, 2018, which is hereby incorporated by reference herein in its entirety.

BACKGROUND OF THE INVENTION

Field of the Invention

The present disclosure generally relates to enclosures for electronic equipment. More particularly, embodiments relate to an enclosure which keeps the environment within the enclosure above the dew point and augments the operational temperature range of the electronic equipment by mixing the waste heat of the equipment with incoming fresh air, thereby reducing operational costs by obviating the need for an HVAC component.

Description of Related Art

Industrial equipment which is specified to be operated indoors typically carries an operational range which matches that of what a building can be regulated to using an HVAC system. Though some equipment may be installed in a separate room from personnel (a dedicated equipment room for example), this room is still held at temperatures suitable for human comfort. Because most industrial equipment produces waste heat, the HVAC system must be at least powerful enough to remove this heat as it is generated. Larger equipment produces more waste heat, which in typical situations must be removed by the HVAC system at the expense of additional power.

The typical operational range of equipment of this category is 0° C. to 40° C. HVAC systems will usually regulate to the middle of this temperature range as this is the most appropriate temperature for human inhabitance. If the outside temperature is at freezing, this means the HVAC system may have to produce additional heat in the room to maintain the set temperature. If it is very hot outside, the HVAC system must work very hard to evacuate both the incoming heat from the outside and the waste heat from the equipment.

Today's expectations for the life expectancy of equipment are quite high. Customers often require a piece of equipment to last as long as 20 years, and sometimes more. An HVAC system may have a useful operating life of half of this; meaning it must be replaced at least once during the life cycle of the equipment. This is a large expense which is not always factored into the purchase price of the equipment. Removal or simplification of the HVAC system can greatly reduce the lifetime cost of operating the equipment.

SUMMARY OF THE INVENTION

As stated above, when operating equipment which is specified for indoor environments, the equipment relies on the building in which it is installed to regulate both the temperature and humidity to acceptable levels. This is typically performed by the use of an HVAC system.

Furthermore, the operational range of the equipment is typically engineered to operate within the limits of the temperature and humidity that an installed HVAC system can accomplish.

Due to these restrictions, indoor equipment cannot typically be operated outside without a complete redesign of the equipment itself, or must be installed in a costly E-house (Electronic equipment house) which regulates the environment for the equipment at great expense.

To solve this issue with minimal expense, embodiments of the invention provide an HVAC-less enclosure which has been designed to regulate incoming outside air to within the operational limits of the equipment. Alternatively, in embodiments, the enclosure or methods described herein can comprise, be combined with, or employ an HVAC system. By using and modulating the wasted heat from the equipment, the enclosure is able to regulate both the temperature and humidity within the enclosure to acceptable levels such that condensation inside the equipment is prevented. Additionally, the recirculation feature of the enclosure allows the equipment to operate at outside temperatures much lower than the stated operational range by modifying the temperature of the intake air before it enters the equipment.

According to embodiments, the enclosure maintains the temperature inside the enclosure to reduce relative humidity by way of an airflow control system mediated by a combination of electromechanical devices (such as fans, dampers, and/or any combination thereof), sensor(s) (such as humidity and/or temperature sensors), and a control device to direct the flow of air. The temperature of the equipment inside the enclosure must stay at or above the air dew point level. If the dew point is higher, then condensation occurs. If the temperature inside the enclosure is hot enough, then the air can be discharged outside the enclosure into the environment. If the temperature inside the enclosure is too cool, then the air is re-circulated to use this hotter air that came from inside the electronic equipment to heat the interior of the enclosure. The sensor(s) can be placed anywhere in the enclosure including on the electronic equipment itself to monitor temperature and/or humidity and provide these measurements to the control device to determine the direction of air flow by regulating the electromechanical devices.

Embodiments include an electronic equipment enclosure which includes a housing capable of enclosing the electronic equipment. The housing includes a first interior compartment or chamber and a second interior compartment or chamber. One or more temperature and/or humidity sensor can be disposed anywhere in the enclosure, including the first interior compartment or chamber and the second interior compartment or chamber. The enclosure also includes a controller which receives input from the temperature and/or humidity sensors.

In embodiments, the first interior compartment or chamber is configured to receive heated exhaust air from the electronic equipment and direct the flow of exhaust air outside the housing and/or into the second interior compartment or chamber by way of one or more electromechanical device. The second interior compartment or chamber is configured to receive air from outside the housing and/or from the first interior compartment or chamber and provide for an airflow into an airflow intake of the electronic equipment. The one or more temperature and/or humidity sensor is configured to send a signal to the controller, and the controller is configured to send a signal to one or more electromechanical device of the first interior compartment or chamber to change the flow of exhaust air in response to the signal from the one or more temperature and/or humidity sensors.

In embodiments, the one or more electromechanical device of the electronic equipment enclosure include at least one first electromechanical device disposed at an airflow outlet of the electronic equipment, at least one second electromechanical device disposed in a portion of an exterior wall of the enclosure which separates the first interior compartment or chamber from the exterior of the enclosure, and at least one third electromechanical device disposed in an interior wall of the enclosure which separates the first interior compartment or chamber and second interior compartment or chamber.

In embodiments, the one or more electromechanical device includes a fan, an electromechanical damper, or any combination of these.

In embodiments, the at least one first electromechanical device includes a fan, and the at least one second electromechanical device and/or at least one third electromechanical device include an electromechanical damper.

In embodiments, the second interior compartment or chamber is configured to receive air from outside the housing by way of one or more passive intake dampers disposed in an exterior wall of the housing. The one or more passive intake dampers can include an air pressure-sensitive damper.

In embodiments, the housing includes multiple exterior and interior walls defining the first and second interior compartment or chamber, such as six exterior walls and at least two interior walls. The at least two interior walls define the first interior compartment or chamber as an exhaust plenum chamber.

Embodiments of the invention also include a method of controlling the temperature inside an enclosure which includes receiving heated exhaust air from one or more electronic equipment disposed inside the enclosure in a first interior compartment or chamber, measuring a temperature and/or humidity inside the enclosure within the first interior compartment or chamber and/or a second interior compartment or chamber, and adjusting a flow of exhaust air from the first interior compartment or chamber to flow outside the enclosure and/or to the second interior compartment or chamber in response to the measured temperature and/or humidity.

In embodiments, the method of controlling the temperature inside the enclosure further includes receiving air from outside the enclosure in the first and/or second interior compartment or chamber.

In embodiments, the method of controlling the temperature inside the enclosure further includes mixing the heated exhaust air from the first interior compartment or chamber with the air received from outside the enclosure in the second interior compartment or chamber to provide for a mixed airflow.

In embodiments, the method of controlling the temperature inside the enclosure further includes receiving, in an air intake in the electronic equipment, the mixed airflow.

In embodiments, adjusting a flow of exhaust air from the first interior compartment or chamber includes sending an electronic control signal to one or more of the electromechanical devices.

In embodiments, receiving air from outside the enclosure in the second interior compartment or chamber is by way of one or more of the passive intake dampers (e.g. air pressure-sensitive damper).

These embodiments and additional embodiments and their features will be provided in the foregoing Detailed Description.

BRIEF DESCRIPTION OF THE DRAWINGS

The accompanying drawings illustrate certain aspects of embodiments of the present invention, and should not be used to limit the invention. Together with the written description the drawings serve to explain certain principles of the invention.

DETAILED DESCRIPTION OF VARIOUS EMBODIMENTS OF THE INVENTION

Reference will now be made in detail to various exemplary embodiments of the invention. It is to be understood that the following discussion of exemplary embodiments is not intended as a limitation on the invention. Rather, the following discussion is provided to give the reader a more detailed understanding of certain aspects and features of the invention.

Figure 1:
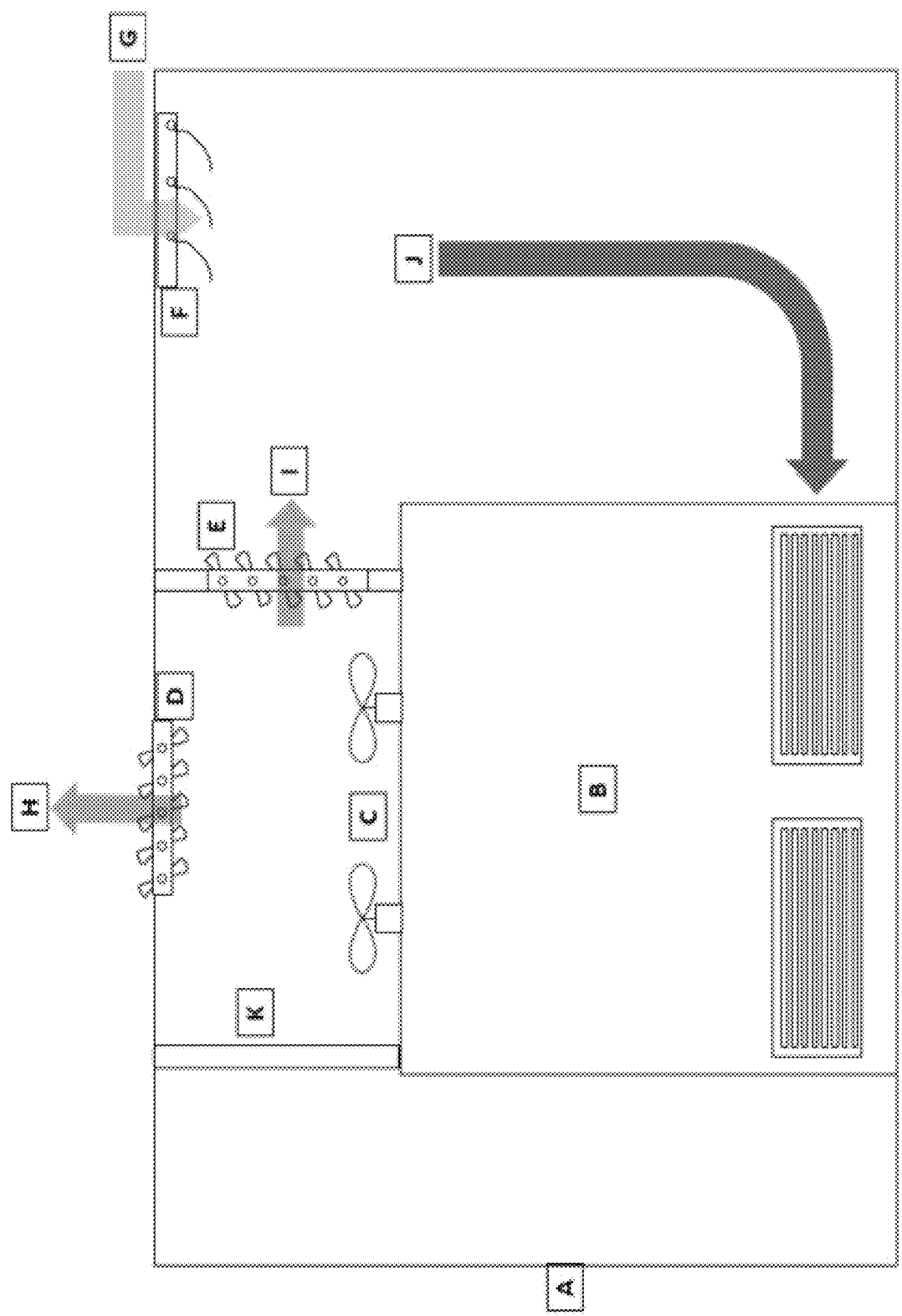
FIG. 1 is a schematic diagram of an enclosure according to an embodiment.

FIG. 1 outlines various features of one illustrative embodiment. The following key lists the various components of the assembly:
A. Enclosure housing
B. Equipment
C. Exhaust fans
D. Exhaust damper
E. Recirculation damper
F. Intake damper
G. Intake airflow
H. Exhaust airflow
I. Recirculated airflow
J. Mixed airflow
K. Exhaust plenum.

It should be noted that the arrangement of the above features in the assembly of FIG. 1 is merely provided as one illustrative embodiment. One skilled in the art can appreciate modifications of this arrangement such as a different number of fan(s) and/or damper(s) at different locations within the assembly which provide similar functional advantages (such as airflow) which fall within the scope of the invention. For example, any number of fans and/or dampers can be used, including from above zero to 20, such as from 1-15, or 2-10, or 3-8, or 4-12, or 7-18, or from 5-14, and so on.

An enclosure (component A) holds the electronic equipment (component B). According to the embodiment shown in FIG. 1, the enclosure is a six-sided enclosure which includes two opposing horizontal sides, two opposing vertical sides, and two opposing lateral sides. The enclosure is further subdivided into two interior compartments or chambers by interior walls. According to the embodiment shown in FIG. 1, one or more such as at least two interior walls provide an exhaust plenum chamber (component K) by dividing the space at the top of the electronic equipment (component K) from the rest of the enclosure interior. FIG. 1 shows two opposed interior walls forming such space, but it should be recognized that additional interior walls can be provided to separate the space at the top of the electronic equipment, or that one or more sides of the housing can provide one or more wall of the exhaust plenum. In this way, the enclosure includes a first compartment or chamber (the exhaust plenum chamber, component K), the electronic equipment itself (component B), and a second compartment or chamber (i.e. the remaining space in the enclosure), and any other number of compartments needed.

The enclosure also houses electromechanical airflow control devices. These include exhaust fans (component C) of the electronic equipment which direct airflow from the equipment into the exhaust plenum chamber (component K) rather than directly back into the enclosure. The electromechanical airflow control devices include electromechanical dampers housed in the exhaust plenum chamber which include one or more sets of exhaust dampers (component D) and one or more sets of recirculation dampers (component E) which can direct the exhaust air outside the exhaust plenum, outside the enclosure (by component D) and/or into the remaining space in the enclosure (by component E). These dampers are electronically controlled and modulated so that the enclosure can modulate the amount of exhaust air that is allowed to leave the enclosure and the amount that is allowed to be recirculated within the enclosure. A set of passive intake dampers (component F) responds to the air demand of the system, and allows make-up air to flow into the enclosure to replace any air exhausted outside the enclosure by the exhaust damper (component D).

Figure 2:
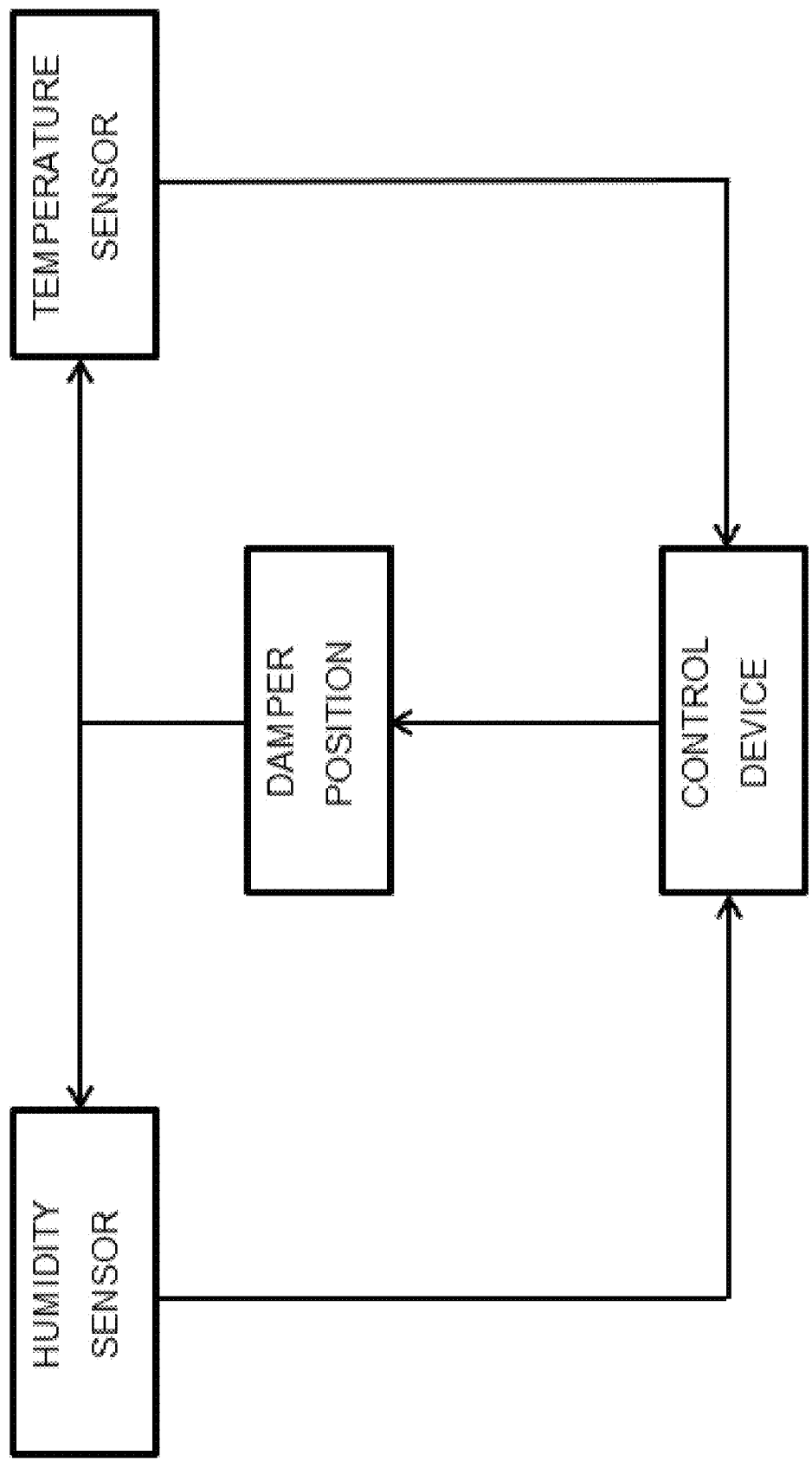
FIG. 2 is a diagram of feedback loop(s) for adjusting damper position of an enclosure according to an embodiment.

Modulation of temperature inside the enclosure happens by means of temperature and/or humidity sensors installed inside of the enclosure (not shown). A control device (not shown) reads the information from the sensor(s), then dictates positions for the exhaust and recirculation dampers. Feedback loop(s) (shown in FIG. 2) inform the control device if the commanded position of the dampers is regulating the enclosure temperature and/or humidity to value(s) requested by the control device, and the commanded positions are adjusted accordingly.

The temperature and/or humidity sensors can be installed anywhere inside the enclosure, including within or outside the exhaust plenum chamber, within the electronic equipment, or on the electronic equipment. One or more additional sensor(s) can be installed outside the enclosure as well. The control device can similarly be installed anywhere within or outside the enclosure, provided that such device can receive input from the sensors and send commands to one or more of the electromechanical dampers.

Humidity and temperature control are achieved by mixing an amount of outside air (component G) with air carrying wasted heat from the equipment (component I). This air is mixed inside the enclosure (component J) to attain a desirable temperature and humidity level. The rate of flow from the equipment and/or the outside air can be adjusted by the fans and dampers to achieve the desired air temperature and/or humidity. The mixed air then enters the intake of the equipment. Unused heat is discarded in the exhaust airstream.

The enclosure housing (component A) can be made of any suitable material, including metal such as stainless steel or aluminum, as well as plastic. The electronic equipment (component B) can be any electronic equipment which generates heat and is in need of cooling, including those used in the power control industries. The exhaust fans (component C) can be any suitable fan, such as a constant-speed fan, a fan with one or more discrete speeds, or a variable-speed fan as are known in the art. The electronically controlled exhaust dampers (component D) and recirculation dampers (component E) can be any electromechanical damper controllable by a control device. An example of an electromechanical damper is a power-open/spring-return, single-panel motorized channel-style damper such as the DAYTON® Hat Channel Motorized Damper, 100-240V available from W.W. Grainger, Inc. (Lake Forest, IL). The passive intake dampers (component F) can be any set of non-motorized dampers which respond to the air demand of the system. They are configured to respond to changes in air pressure (i.e. open when there is negative air pressure inside the system relative to outside the system). An example of a pressure activated damper is described in U.S. Pat. No. 9,706,683. While the '683 patent describes this as a gravity-operated damper that automatically pivots open in response to positive pressure within the interior of an enclosure, such damper can be configured or adapted to respond to positive pressure outside an enclosure to passively let air into the enclosure in response to such pressure differentials. The exhaust plenum (component K) can be constructed from the same materials as the walls of the enclosure housing (component A) or different materials, and provides a separate compartment or chamber inside the enclosure for directing the flow of air exhausted from the equipment (component B). The temperature and humidity sensors can be any such sensors capable of sending an electronic signal to the control device indicative of such conditions. Such temperature sensors can include a thermistor, resistance temperature detector (RTD), thermocouple, or semiconductor-based sensor, and such humidity sensors can include a capacitive, resistive, or thermal humidity sensor.

According to embodiments, any of the electromechanical devices for directing the flow of air can be used at any location within the enclosure. For example, fans can be provided to direct the intake of air into the electronic equipment, alternatively or in addition to directing exhaust air from the equipment. Further, in some embodiments, the control device also sends commands to the fan(s) to increase or decrease the flow of air through the system, in addition to directing the exhaust air outside the enclosure or within the enclosure for recirculation.

According to embodiments, the enclosure includes an internal power storage such as a rechargeable battery, and/or a connection to an external power source such as a three-phase electric power supply and/or any power supply which powers the electronic equipment within the enclosure.

According to embodiments, the enclosure assembly does not include any heating or air conditioning component. The assembly relies entirely on air flow for regulating the temperature inside the enclosure.

According to embodiments, the control device is a computing device or devices which can receive signals from the sensor(s), perform one or more calculations, and send a control signal to the exhaust and/or recirculation dampers to modify their position to either increase or decrease the amount of air flow through them. The one or more calculations can be performed according to one or more algorithms embodied in software. The computing device or devices can include one or more processor (CPU) and a computer memory. The computer memory can be or include a non-transitory computer storage media such as RAM which stores a set of computer-readable (also known herein as computer executable) instructions (software) for instructing the processor(s) to carry out any of the algorithms, methods, or routines described in this disclosure. As used in the context of this disclosure, a non-transitory computer-readable medium (or media) can include any kind of computer memory, including magnetic storage media, optical storage media, nonvolatile memory storage media, and volatile memory. Non-limiting examples of non-transitory computer-readable storage media include floppy disks, magnetic tape, conventional hard disks, CD-ROM, DVD-ROM, BLU-RAY, Flash ROM, memory cards, optical drives, solid state drives, flash drives, erasable programmable read only memory (EPROM), electrically erasable programmable read-only memory (EEPROM), nonvolatile ROM, and RAM. The computer-readable instructions can be programmed in any suitable programming language, including JavaScript, C, C #, C++, Java, Python, Perl, Ruby, Swift, Visual Basic, and Objective C.

A skilled artisan will further appreciate, in light of this disclosure, how the invention can be implemented, in addition to software and hardware, using one or more firmware. As such, the control device disclosed herein can be implemented in a system which includes any combination of software, hardware, or firmware. In the context of this specification, the term "firmware" can include any software programmed onto the control device, such as a device's nonvolatile memory. Thus, systems of the invention can also include, alternatively or in addition to the computer-executable instructions, various firmware modules configured to perform the operations and commands of the control device.

According to one embodiment, the control device includes a display for displaying the requested values of the temperature and/or humidity inside the enclosure as well as the current values read by the sensors. The control device can also include an input such as a numerical keypad for entering the requested values of temperature and/or humidity inside the enclosure. According to other embodiments, the control device provides for a wired or wireless connection to a separate computing device such as a mainframe computer, desktop computer, laptop, tablet, netbook, notebook, personal digital assistant (PDA), gaming console, e-reader, smartphone, or smartwatch, which may include features such as a processor, memory, hard drive, graphics processing unit (GPU), and input/output devices such as display, keyboard, and mouse or trackpad (depending on the device). The wired connection can be by way of a USB or other input/output port and the wireless connection can be by way of WiFi, Bluetooth®, or infrared. According to one embodiment, the control device can be monitored such that the temperature and/or humidity measurements can be communicated to the separate computing device and displayed on its display. The control device can also be programmed by receiving input from a separate computing device such that the requested temperature and/or humidity values to be maintained inside the enclosure can be adjusted.

According to other embodiments, the control device and/or separate computing device are connected to a network through any suitable network protocol such as IP, TCP/IP, UDP, or ICMP. Further, the control device and/or separate computing device can be part of a networked computer system. The networked computer system can include any of the computing devices described herein connected through a network. The network can use any suitable network protocol and can be any suitable wired or wireless network including any local area network, wide area network, Internet network, telecommunications network, Wi-Fi enabled network, or Bluetooth enabled network. According to one embodiment, the control device receives local weather data such as temperature, wind speed, humidity, and/or dew point through the network reflecting these conditions outside the enclosure. The local weather data can be from an internet provider and/or from a weather station outside the enclosure.

Embodiments also include a method of controlling the temperature inside an enclosure which includes receiving heated exhaust air from one or more electronic equipment disposed inside the enclosure in a first interior compartment or chamber, measuring a temperature and/or humidity inside the enclosure within the first interior compartment or chamber and/or a second interior compartment or chamber, and adjusting a flow of exhaust air from the first interior compartment or chamber to flow outside the enclosure and/or into the second interior compartment or chamber, and/or into another compartment or chamber in response to the measured temperature and/or humidity. The method can include the control of the air temperature inside any enclosure described herein, based on any one or more of the features of such enclosure described herein. One or more steps of the method can be carried out by way of the computer-executable instructions.

According to embodiments, the enclosure augments the operational temperature range of the electronic equipment by recirculating the heated air that exits the equipment back into the intake of the equipment. As such, in addition to keeping the intake air at or above the dew point level, thereby preventing condensation and damage to the electronic equipment, the enclosure allows for operation of the electronic equipment in winter conditions in colder climates.

The present invention has been described with reference to particular embodiments having various features. In light of the disclosure provided above, it will be apparent to those skilled in the art that various modifications and variations can be made in the practice of the present invention without departing from the scope or spirit of the invention. One skilled in the art will recognize that the disclosed features may be used singularly, in any combination, or omitted based on the requirements and specifications of a given application or design. When an embodiment refers to "comprising" certain features, it is to be understood that the embodiments can alternatively "consist of" or "consist essentially of" any one or more of the features. Other embodiments of the invention will be apparent to those skilled in the art from consideration of the specification and practice of the invention.

It is noted in particular that where a range of values is provided in this specification, each value between the upper and lower limits of that range is also specifically disclosed. The upper and lower limits of these smaller ranges may independently be included or excluded in the range as well. The singular forms "a," "an," and "the" include plural referents unless the context clearly dictates otherwise. It is intended that the specification and examples be considered as exemplary in nature and that variations that do not depart from the essence of the invention fall within the scope of the invention. Further, all of the references cited in this disclosure are each individually incorporated by reference herein in their entireties and as such are intended to provide an efficient way of supplementing the enabling disclosure of this invention as well as provide background detailing the level of ordinary skill in the art.

The invention claimed is:

1. An electronic equipment enclosure comprising:
   a housing capable of enclosing electronic equipment and comprising a first interior compartment and a second interior compartment;
   one or more temperature sensor;
   one or more humidity sensor; and
   a controller;
   wherein:
   the first interior compartment is an exhaust plenum chamber and is configured for direct communication with and to receive heated exhaust air from the electronic equipment and to direct a flow of exhaust air to outside of the housing and/or into the second interior compartment by way of one or more dampers, wherein at least one of the dampers is an active damper, at least one of the dampers is disposed in a portion of an exterior wall of the housing which separates the first interior compartment from the outside of the housing, and at least one of the dampers is disposed in an interior wall of the housing which separates the first interior compartment and the second interior compartment;

the second interior compartment is configured to receive air from the outside of the housing and/or the first interior compartment and provide for an airflow into an airflow intake of the electronic equipment;

one or more of the temperature sensors and one or more of the humidity sensors is configured to send a signal to the controller; and the controller is configured to send a signal to one or more of the active dampers of the first interior compartment to change the flow of exhaust air in response to the signal from one or more of the temperature sensors and one or more of the humidity sensors.

2. The electronic equipment enclosure of claim 1, wherein at least one of the active dampers comprises a fan.

3. The electronic equipment enclosure of claim 1, wherein at least one of the active dampers comprises an electromechanical damper.

4. The electronic equipment enclosure of claim 1, wherein the second interior compartment is configured to receive the air from the outside of the housing by way of one or more intake dampers disposed in an exterior wall of the housing.

5. The electronic equipment enclosure of claim 4, wherein one or more of the intake dampers comprises an air pressure-sensitive damper.

6. The electronic equipment enclosure of claim 1, wherein the housing comprises a plurality of exterior and interior walls defining the first and second interior compartment.

7. The electronic equipment enclosure of claim 1, wherein the housing comprises at least six exterior walls.

8. The electronic equipment enclosure of claim 1, wherein the housing comprises at least two interior walls.

9. A method of controlling a temperature and humidity inside an enclosure, comprising:
receiving heated exhaust air into a first chamber, that is an exhaust plenum chamber, from one or more electronic equipment disposed inside the enclosure and which electronic equipment is in direct communication with the first chamber;
measuring a temperature and a humidity inside the enclosure within a second chamber and/or within the first chamber;
adjusting a flow of exhaust air, by way of one or more passive or active dampers, from the first chamber to flow outside the enclosure and/or to the second chamber in response to the measured temperature and humidity, wherein at least one passive or active damper is disposed in an exterior wall of the enclosure and is disposed in an interior wall of the enclosure which separates the first chamber from the second chamber; and
receiving air from the outside of the enclosure in the second chamber, mixing the heated exhaust air from the first chamber with the air received from outside the enclosure in the second chamber to provide for a mixed airflow, and receiving, in an air intake in the electronic equipment, the mixed airflow.

10. The method of claim 9, wherein the receiving of the air from the outside of the enclosure in the second chamber is by way of one or more intake dampers.

11. The method of claim 10, wherein the one or more intake dampers comprises an air pressure-sensitive damper.

12. An electronic equipment enclosure housing comprising:
an enclosure comprising a first compartment and a second compartment, wherein the enclosure is configured to encase one or more electronic equipment component;
an intake comprising one or more pressure sensitive dampers;
wherein the first compartment is configured for direct communication with an exhaust of the electronic equipment component, and the first compartment comprises first and second electronically controlled dampers;
wherein exhaust is capable of flowing into the first compartment directly from the electronic equipment component and flowing through the first electronically controlled damper to exit the enclosure and/or through the second electronically controlled damper into a second compartment in communication with the electronic equipment component; and
a control device capable of analyzing temperature and humidity of an environment within the enclosure to determine a signal to output to one or more of the electronically controlled dampers and to control the amount of exhaust exiting the enclosure and/or entering the second compartment.

13. The enclosure of claim 12, wherein the first compartment comprises electronically controlled dampers which control an amount of exhaust air capable of being redirected back into the enclosure.

14. The enclosure of claim 12, wherein the control device is configured to augment a normal operation temperature range of the one or more electronic equipment component by mixing waste heat so as to present intake air to the equipment which meets the normal operation temperature range.

15. The enclosure of claim 12, wherein the enclosure does not require any heating or air conditioning component.

16. The enclosure of claim 12, wherein only the exhaust is capable of flowing into the first compartment directly from the electronic equipment component.

* * * * *